United States Statutory Invention Registration [19]

[11] Reg. Number: H204

Oh et al. [43] Published: Feb. 3, 1987

[54] METHOD FOR IMPLANTING THE SIDEWALLS OF ISOLATION TRENCHES

[75] Inventors: Kye H. Oh, Allentown; David S. Yaney, Bethlehem, both of Pa.

[73] Assignee: AT&T Bell Laboratories

[21] Appl. No.: 676,250

[22] Filed: Nov. 29, 1984

[51] Int. Cl.[4] ..... B44C 1/22; C03C 15/00; H01L 21/00; H01L 21/461

[52] U.S. Cl. ..... 156/648; 156/651; 156/653; 156/657; 156/659.1; 156/662; 29/576 W; 29/580; 148/187; 427/93; 427/94; 427/95; 357/49

[58] Field of Search ..... 156/648; 29/576 B, 576 W, 29/578

[56] References Cited

U.S. PATENT DOCUMENTS

| | | | |
|---|---|---|---|
| 4,139,442 | 2/1979 | Bondur et al. | 204/192 E |
| 4,211,582 | 7/1980 | Horng et al. | 148/1.5 |
| 4,238,278 | 12/1980 | Antipov | 156/648 |
| 4,389,281 | 6/1983 | Anantha et al. | 156/646 |
| 4,472,240 | 9/1984 | Kameyama | 29/576 W |
| 4,472,873 | 9/1984 | Ko | 29/578 |
| 4,495,025 | 1/1985 | Haskell | 29/576 W |
| 4,526,631 | 7/1985 | Silvestri et al. | 29/576 W |
| 4,528,047 | 7/1985 | Beyer et al. | 29/576 W |
| 4,534,824 | 8/1985 | Chen | 156/648 |

FOREIGN PATENT DOCUMENTS

| | | | |
|---|---|---|---|
| 90111 | 10/1983 | European Pat. Off. | 29/576 W |
| 36941 | 2/1984 | Japan | 29/576 W |

OTHER PUBLICATIONS

"The Diffusion of Boron . . .", *Solid State Electronics,* vol. 15, 1972, P. R. Wilson, pp. 961–970.

"Dopant Segregation in Polycrystalline . . .", *Journal of Applied Physics,* vol. 51, No. 11, Nov. 1980, T. I. Kamins, pp. 5755–5763.

"A Study of the Trench . . .", *IEEE Electron Device Letters,* vol. EDL–4, No. 9, Sep. 83, K. M. Cham et al. pp. 303–305.

*Primary Examiner*—John F. Terapane
*Assistant Examiner*—Eric Jorgensen
*Attorney, Agent, or Firm*—Wendy W. Koba

[57] ABSTRACT

A method of implanting ions into the sidewalls of isolation trenches is disclosed. The method utilizes a series of ion implants to produce concentrations of the ion, in most cases boron, along the depth of the trench. Since the ion concentration exhibits a Gaussian distribution function which tails off rapidly, the width of the trench is narrowed after the implantation to guarantee a sufficient boron concentration at the sidewalls of the trench. A layer of an insulating material is used to narrow the trench, where a conformal coating of the material will cover the sidewalls of the window and narrow the opening through the window. By increasing the boron doping in the sidewalls, the effects of boron segregation between the substrate and the isolation trench will be counteracted, thus eliminating the problem of creating an n-type inversion layer between the trench and the substrate.

11 Claims, 10 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR IMPLANTING THE SIDEWALLS OF ISOLATION TRENCHES

BACKGROUND OF THE INVENTION

1. Field of the Invention

The present invention relates to a method for implanting the sidewalls of isolation trenches and, more particularly, to a method for implanting trench sidewalls which utilizes a series of ion implants and a subsequent narrowing of the window through which the trench is formed to provide a sufficient level of dopant concentration in the trench sidewalls.

2. Description of the Prior Art

Advanced large scale integrated circuit design requires a method of providing isolation between various components located on the same substrate which does not demand a large surface area of the substrate. Trench isolation has evolved as the preferred method of isolation, where narrow trenches, filled with a dielectric, can be placed between components and provide excellent isolation between components which are closely spaced. A problem with this method, however, relates to the dopant segregation from the substrate during a brief oxidation process along the trench, where this oxidation is required to keep a clean interface. For example, in a boron doped p-type substrate which includes an isolation trench filled with silicon dioxide, the boron will move from the silicon substrate into the silicon dioxide. Moreover, an inversion may occur along the portion of the silicon substrate which borders the silicon dioxide-filled trench, due to the positive fixed charge. Therefore, in the case where the trench is being utilized to separate two closely spaced n-type regions, the presence of the n-type inversion layer between the regions serves as a conduction path, thus degrading the isolation between the two regions.

One method of overcoming this problem is to separate the components to be isolated by an amount sufficient to disrupt the conduction path around the trench sidewalls. However, when a large number of components need to be separated from one another on a single substrate, the amount of silicon area required for this method becomes extremely costly. In an alternative method, a "channel stop" is placed at the bottom of the trench to break the conduction path between the two regions to be isolated. As disclosed in U.S. Pat. No. 4,211,582 issued to C. T. Horng et al. on July 8, 1980, a p+ implant is formed at the bottom of the trench to prevent an inversion layer from forming at the bottom of the trench along the interface with the substrate. In particular, by enforcing the presence of p-type donors, the boron concentration in the silicon substrate will be sufficient to prevent the interface from inverting, even after the boron segregation during the subsequent oxidation. Therefore, the likelihood of an n-type inversion layer being fromed at the bottom of the trench is significantly reduced.

Although this method is sufficient for eliminating the invention layer at the bottom of the trench, the boron segregation which takes place along the sidewalls of the trench may result in forming an inversion layer around the sidewalls of the isolation trench for the same reasons as stated above. Therefore, a conduction path still exists between the two components via the inverted sidewalls. A problem remaining in the prior art, therefore, is to provide a method for doping the sidewalls of an isolation trench which prevents any sidewall inversion and provides complete isolation.

SUMMARY OF THE INVENTION

The problem remaining in the prior art has been solved in accordance with the present invention which relates to a method for implanting the sidewalls of isolation trenches and, more particularly, to a method for implanting trench sidewalls which utilizes a series of ion implantations and a subsequent narrowing of the window through which the trench is formed to provide a sufficient level of dopant concentration in the trench sidewalls.

It is an aspect of the present invention to narrow the window used as an etch mask in the formation of the trench to a value such that the final sidewalls of the trench are located close to the peak dopant concentration.

Another aspect of the present invention is to utilize a series of boron implants to insure that the dopant concentration maintains a fairly uniform profile along the sidewalls of the trench.

Yet another aspect of the present invention is to provide a method of utilizing narrow width isolation trenches (even beyond the practical optical lithography limit), since in the prior art, the lack of a method for implant trench sidewalls prevented the utilization of narrow (less than one micron) width isolation trenches.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
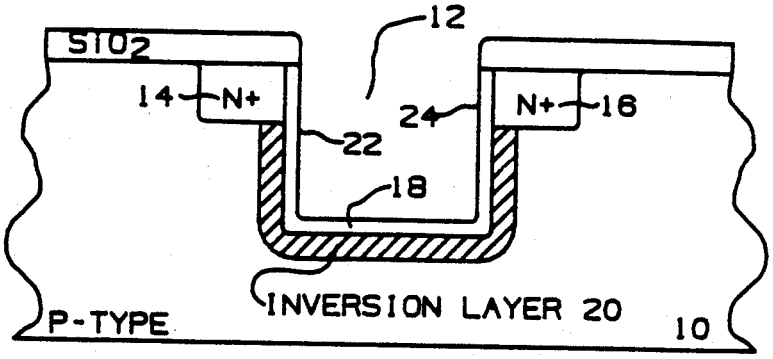
FIG. 1 (PRIOR ART)
FIG. 1 illustrates a cross-sectional view of a prior art isolation trench.

FIG. 1 illustrates a conventional isolation trench 12 formed in a p-type substrate 10, where trench 12 may be formed by any suitable etching technique. Here, isolation trench 12 is needed to separate a first n+ region 14 from a second n+ region 16 along the wall and through the bottom of trench 12. When a silicon dioxide layer 18 is grown on the surface of trench 12 to keep a clean interface, trench 12 may be inverted. This inversion layer 20 is illustrated in FIG. 1. As discussed earlier, the presence of this inversion layer 20 results in the formation of a conduction path between n+ region 14 and n+ region 16. As stated above, the inversion layer may be eliminated at the bottom of trench 12 by ion implanting a p+ type region at the bottom of trench 12. The response of additional p-type donors will keep the p-type dopant concentration present in the bottom of trench 12, usually boron, at a sufficient level to counter the boron segregation during oxidation. This additional concentration will raise the surface threshold voltage for inversion and thereby disrupt the conduction path between n+ region 14 and n+ region 16. However, as discussed above, sidewalls 22 and 24 of trench 12 cannot be ion implanted by this process, since the width of a isolation trench is ideally on the order of one micron (if not smaller) and a conventional ion implant beam cannot be tilted sufficiently to direct an ion beam at the sidewalls. Therefore, an inversion layer will still exist around the sidewalls of trench 12, forming a conduction path between n+ region 14 and n+ region 16.

FIG. 2-10 illustrate the process used in accordance with the present invention to ion implant the sidewalls of an isolation trench and thus provide complete isolation between two adjoining n-type regions. By ion implanting both the sidewalls and the bottom of the trench, a sufficient increase in boron concentration can be achieved and the entire conduction path will be eliminated, insuring that no signal can travel between the adjoining regions.

Figure 2:
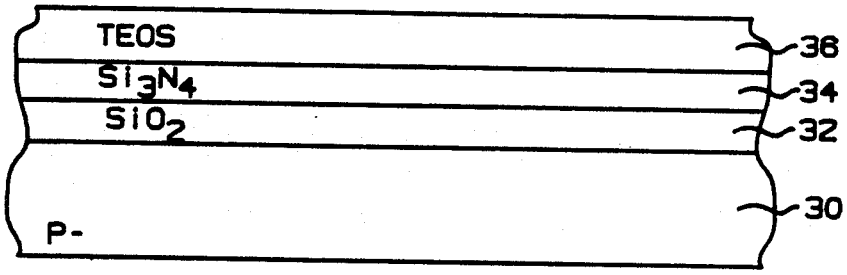
FIGS. 2–10 illustrate cross-sectional views of the structure obtained a successive times during the fabrication of an isolation trench formed in accordance with the present invention.

FIG. 2 shows the starting material used to form both the active devices and the isolation trenches there between, where it is to be understood that for the sake of clarity only the process for forming isolation trenches will be discussed. It is to be understood that there may exist intervening steps in the process for the formation of the active devices on the substrate.

Referring to FIG. 2, a p-type substrate 30 is oxidized to form a silicon dioxide layer 32 over the entire surface of substrate 30, where a 150 to 300 Å layer is sufficient to minimize the stress resulting from a nitride which will be subsequently deposited. The abovementioned silicon nitride layer 34 is subsequently deposited over silicon dioxide layer 32, where layer 34 may comprise a height of approximately 1200 to 2400 Å. A silicon dioxide layer 36 is next deposited by decomposing tetraethyl orthosilicate, where this compound, abbreviated TEOS, is well known in the art as providing an excellent conformal coating of insulating $SiO_2$.

Figure 3:
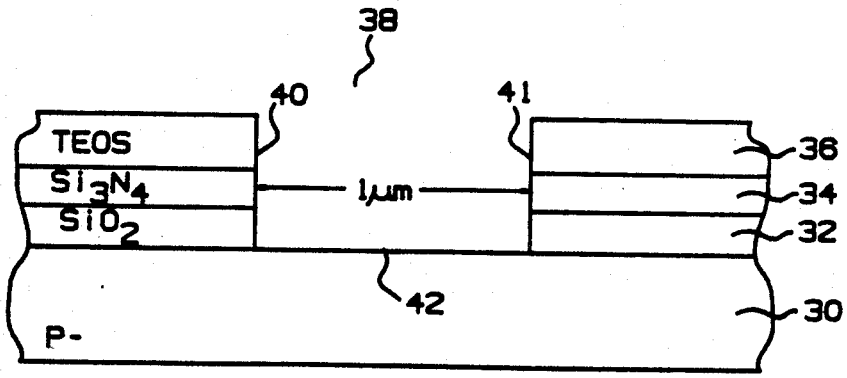
Figure 4:
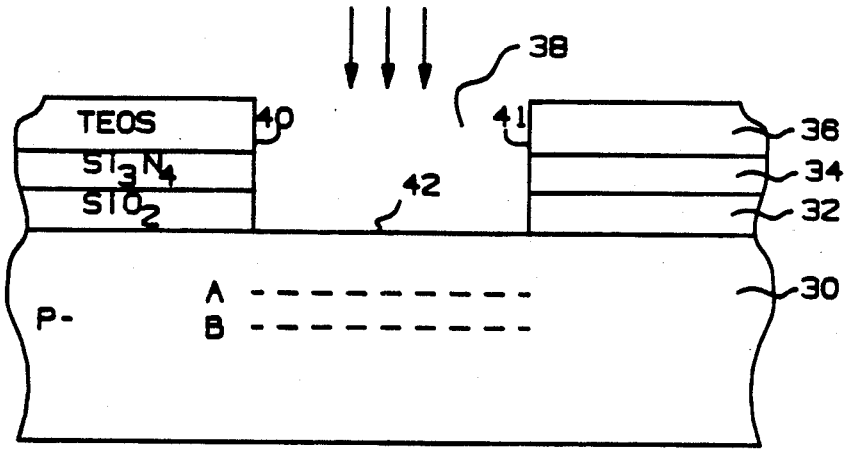
Figure 5:
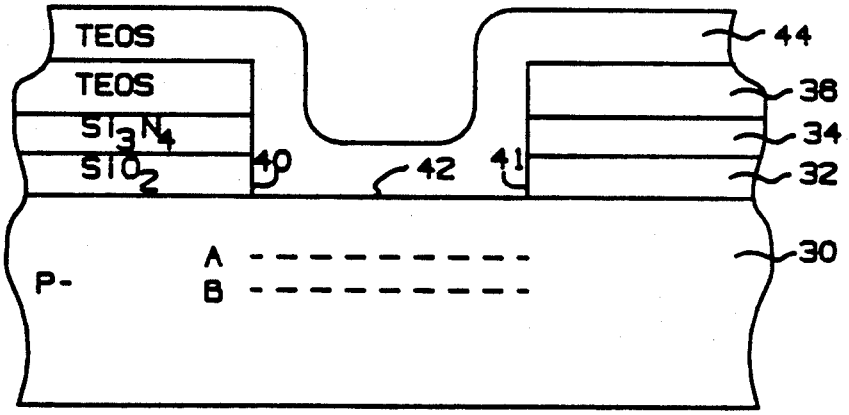

The silicon structure of FIG. 2 is next patterned by conventional photolithography techniques (not shown) and is selectively etched to produce narrow openings, or windows, 38 having substantially vertical sidewalls 40 and 41 and horizontal bottom surfaces 42, as shown in FIG. 3. In particular, a dry etch which has a high etch selectivity between the dielectric and the silicon may be used to form windows 38. The width of window 38, as indicated in FIG. 3, is on the order of one micron. As described above, ion implantation of p-type donors is used to increase the p-type concentration which counters the effect of boron segregation between the substrate and the isolation trench. For the purposes of the present invention, ion implantation of boron follows the above-described window formation process, where a first series of ion implants is utilized to increase the dopant concentration along the sidewalls of the isolation trench. The ion implantation is highly directional in the vetical direction and the first may be performed at, for example, 45 KeV with a dose of $1\times10^{13}$ atoms/cm$^2$, to reach a depth of approximately 1500 Å, as indicated by the letter A in FIG. 4. A second ion implantation may be performed at, for example, 140 KeV with a dose of $1.5\times10^{13}$ atoms/cm$^2$ to reach a depth of approximately 4000 Å, as indicated by the letter B. It is well known that this type of ion implantation results in a Gaussian doping profile. Therefore, a thermal treatment is preformed subsequent to the boron implant to "flatten" the Gaussian distribution of the boron ions and insure that a relatively uniform as well as sufficient dopant concentration will exist along the sidewalls of the isolation trench to be formed during a subsequent processing step. It is to be noted that any number of ion implants may be utilized to provide sidewall doping, where two implants, as described above, have been found to be sufficient for the purposes of the present invention. Further, the energies of 45 and 140 KeV described above are considered to be exemplary only, where many other combination of implant energies may be utilized in associated with the practice of the present invention.

Figure 6:
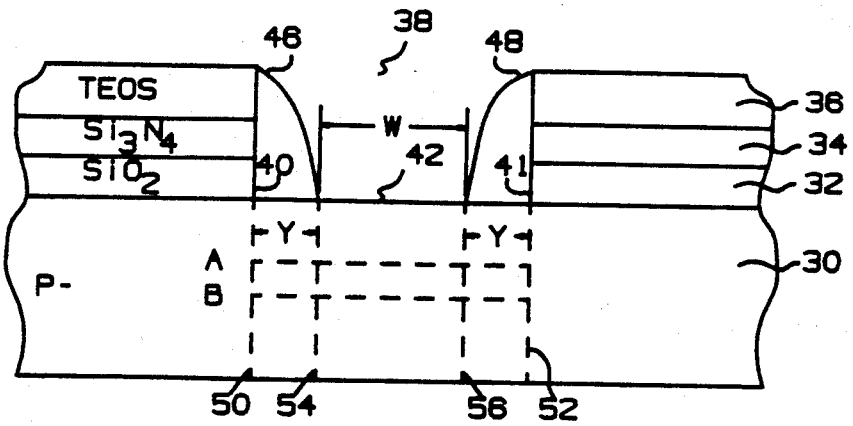

As discussed above, doping of the trench sidewalls in accordance with the present invention is provided by narrowing the width of window 38 prior to the formation of the isolation trench. Accordingly, following the above-described ion implant, the opening of window 38 is narrowed using a conformal coating of a thin masking material 44 applied so as to form the structure illustrated in FIG. 5. TEOS (tetraethyl orthosilicate) may be utilized for conformal coating 44, since it is known for providing a high quality conformal coating. In particular, a thickness of 1000 Å of TEOS layer 44 has been found to be sufficient for the purpose of the present invention. TEOS layer 44 is subsequently removed by an anisotropic dry etching process so that only the portions of layer 44 deposited on sidewalls 40 and 41 of window 38 remain. FIG. 6 illustrates the resultant structure, which contains TEOS regions (or fillets) 46 and 48 along sidewalls 40 and 41, respectively. As shown in FIG. 6, the width of window 38 has been reduced to W, where sidewalls 40 and 41 are now located a distance y from the edge of window 38. In other words, the width of window 38 has been narrowed by an amount 2y, where the value y is dependent on the thickness of TEOS layer 44.

If TEOS fillets 46 and 48 were not present, the the isolation trench would be as indicated by vertical lines 50 and 52 in FIG. 6. Since these sidewalls are very near the "tails" of the Gaussian distributed dopant, only a very small concentration of boron would be implanted in the sidewalls. This amount of dopant has not been found to be sufficient to counteract the effects of boron segregation and the slight overetch of the silicon trench beyond the mask edge, and therefore, would not prevent inversion of the trench sidewalls. Thus, as described above, the isolation trench is narrowed by the addition of TEOS fillets 46 and 48, which results in the sidewalls of the trench (which is yet to be formed) being located along vertical lines 54 and 56. Therefore, the use of TEOS fillets 46 and 48 to narrow window 38 results in a greater concentration of boron being implanted into the sidewalls of the isolation trench, where the amount of TEOS deposited (and thus, the subsequent size of fillets 46 and 48) will control the sidewall dopant concentration. In particular, since sidewalls 54 and 56 contain the peak doping concentration, the amount of boron implanted in sidewalls 54 and 56 by the present technique is more than sufficient to offset the effects of boron segregation and prevent inversion of the sidewalls.

Figure 7:
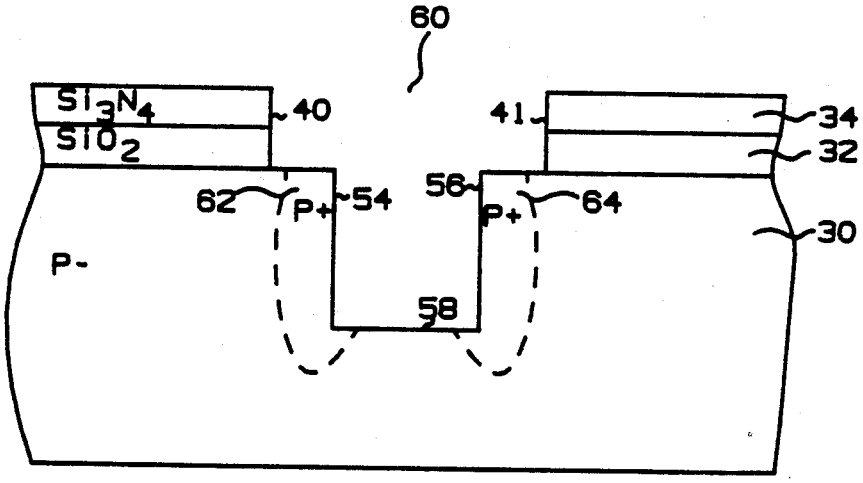
Figure 8:
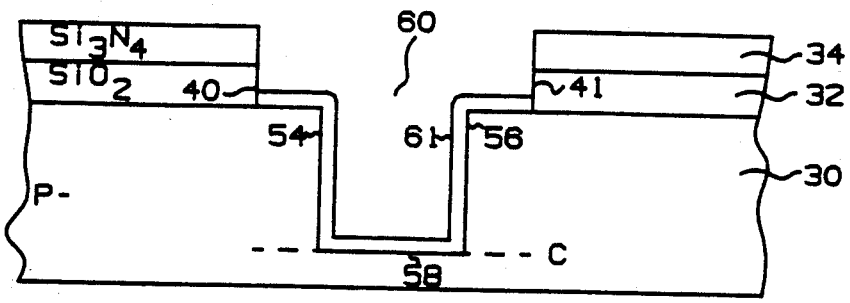

To complete the process, the actual isolation trench is now formed, as shown in FIG. 7. In particular, the structure of FIG. 6 is etched by an anisotropic dry etching process to a depth of approximately 6000 Å to form an isolation trench 60 including vertical sidewalls 54 and 56, and a horizontal bottom 58. Following the anisotropic trench etch, TEOS layer 36, as well as TEOS fillets 46 and 48, are completely etched away, whre buffered hydroflouric acid may be used as an etchant. The resulting structure is illustrated in FIG. 7. Trench 60 is subsequently oxidized (after chemical cleaning) to form a thin silicon dioxide layer 61 (of approximately 1000 Å) around the surfce of trench 60 as shown in FIG. 8. Silicon dioxide layer 61 functions to provide a clean interface between trench 60 and the dielectric which is subsequently deposited in trench 60. After oxidizing trench 60 to form layer 61, an additional ion implant is performed to increase the boron concentration at the bottom of trench 60 and prevent the formation of an inversion layer in this region. For example, an ion implant at 30 KeV with a dose of $6\times10^{11}$ atoms/cm$^2$ will provide a boron concentration along horizontal bottom 58 of trench 60, as shown in FIG. 8.

Figure 9:
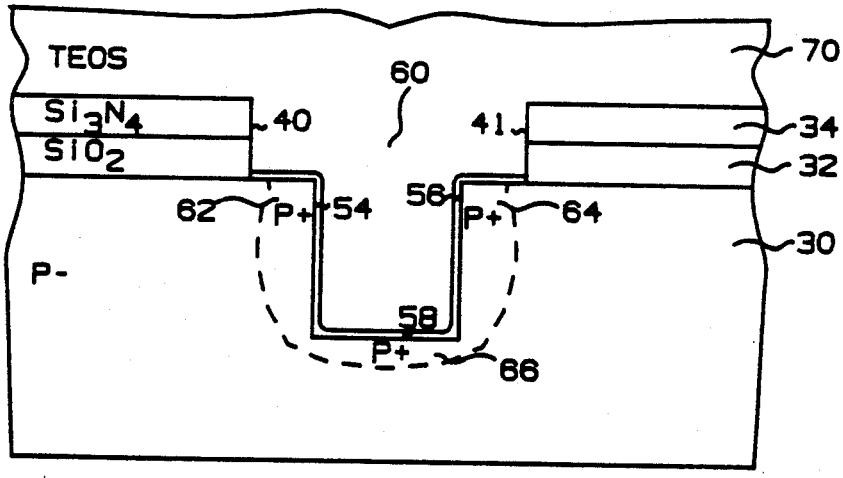
Figure 10:
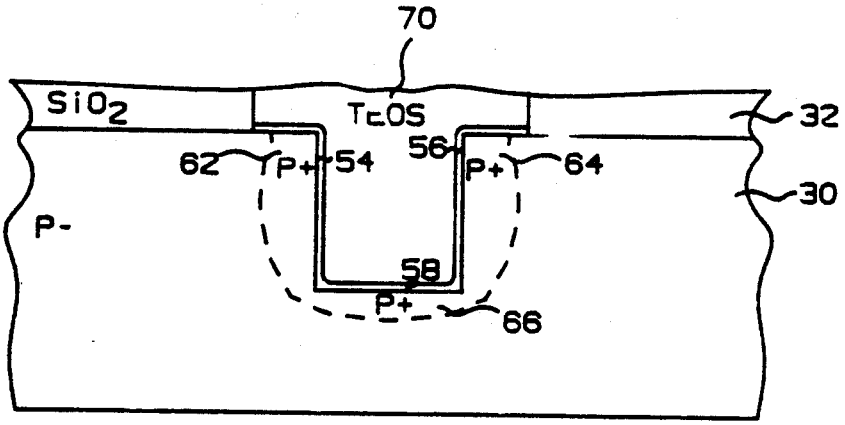

To summarize, in accordance with the ion implantation process of the present invention, a plurality of $p^+$ type regions 62, 64, and 66, associted with sidewalls 54 and 56 and bottom 58, respectively, will comprise a sufficient dopant concentration to counter the segregation of the boron present in substrate 30 into isolation trench 60. As shown in FIG. 9, an insulating material is subsequently uniformly deposited over the entire wafer surface, which will not only fill trench 60, but also result in a flat surface. As stated above, TEOS is known for its conformal coating properties, and may be utilized as the insulating material 70, where in actuality, several layers of TEOS are deposited with an anneal between each deposition to densify and reduce the stress associated with a thick layer of TEOS. This planarized wafer is then subject to a controlled uniform oxide etch, preferably a dry etch, until silicon nitride layer 34 is exposed. Endpoint detection is used in this process to indicate when silicon nitride layer 34 has been reached in order to prevent etching through silicon nitride layer 34 to silicon dioxide layer 32. Under normal circumstances, silicon nitride layer 34 is between 1200 and 2400 Å thick, thus providing a sufficient "sponge", or stopping layer, to protect the underlying silicon dioxide layer 32. A hot phosphoric etch is then used to remove silicon nitride layer 34, where this etch has a high selectivity with respect to silicon dioxide. FIG. 10 illustrates a cross-section of the final planarized structure.

What is claimed is:

1. A method for making isolation trenches comprising substantially vertical sidewalls in a semiconductor substrate, said method comprising the steps of:

(a) depositing a predetermined thickness of a masking material over said substrate;

(b) patterning said masking material to indicate the placement of said isolation trenches;

(c) forming a spaced succession of windows through the masking material formed in step (a) in accordance with the pattern established in step (b), said windows comprising substantially vertical sidewalls and having a substantially horizontal bottom which coincides with the top surface of said substrate;

(d) performing a series of ion implantations through said windows at varying depths into said substrate to implant ions which will coincide with the substantially vertical trench sidewalls;

(e) depositing a conformally coating cover layer over said masking material formed in step (a) such that said conformal coating is also deposited into the windows formed in step (c);

(f) etching said cover layer to remove horizontally disposed conformal coating such that the remaining conformal coating completely covers the vertical sidewalls of said windows and also covers a predetermined portion of the bottom of the windows, said etched conformal coating thereby narrowing the width of said windows;

(g) etching said substrate using said masking material to produce a spaced succession of isolation trenches, wherein said isolation trenches comprise a width determined by the portion of said windows not covered by said conformal coating cover layer;

(h) removing the remaining portions of said conformal covering layer;

(i) oxidizing said isolation trenches;

(j) performing a final ion implantation to implant ions which will coincide with the substantially horizontal bottom of said isolation trench; and (k) thermally oxidizing and subsequently etching said substrate so as to completely fill said spaced succession of isolation trences and planarize the final structure.

2. The method according to claim 1 wherein the substrate is a p-type semiconductor material containing a boron dopant and boron is used as the ion implant in steps (d) and (h).

3. The method according to claim 1 wherein two implants are used for the series of implants in step (d).

4. The method according to claim 3 wherein the first implant uses an energy of 45 keV to provide an ion implant concentration of $1\times10^{13}$ atoms/cm2, and the second implant uses an energy of 140 keV to provide an ion implant concentration of $1.5\times10^{13}$ atoms/cm2.

5. The method according to claim 1 wherein the windows formed in step (c) comprise a width on the order of one micron before the conformal coating of step (e) is applied.

6. The method according to claim 1 wherein the method further comprises the step of:

(l) thermally treating the series of ion implantations of step (d) prior to performing step (e).

7. The method according to claim 1 wherein the masking material of step (a) includes a layer of silicon dioxide formed by oxidizing said substrate, a layer of silicon nitride deposited over the layer of silicon dioxide, and a final layer of silicon dioxide formed by the decomposition of tetraethyl orthosilicate (TEOS), deposited over the silicon nitride.

8. The method according to claim 7 wherein the silicon dioxide layer comprises a thickness of approximately 300 Å, the silicon nitride layer comprises a thickness of approximately 200 Å and the TEOS layer comprises a thickness of approximately 500 Å.

9. The method according to claim 1 wherein the conformal coating of step (e) comprises silicon dioxide formed by decomposition of tetraethyl orthosilicate, defined as TEOS.

10. The method according to claim 9 wherein the conformal coating comprises a thickness of approximately 1000 Å.

11. The method according to claim 1 wherein silicon dioxide formed by decomposition of tetraethyl orthosilicate, is used in step (k).

* * * * *